United States Patent [19]

Chen et al.

[11] Patent Number: 4,876,175
[45] Date of Patent: Oct. 24, 1989

[54] DYE SENSITIZED PHOTOGRAPHIC IMAGING SYSTEMS

[75] Inventors: Chin H. Chen, Fairport, N.Y.; John L. Fox, Baltimore, Md.; Donald P. Specht; Samir Y. Farid, both of Rochester, N.Y.

[73] Assignee: Eastman Kodak Company, Rochester, N.Y.

[21] Appl. No.: 191,947

[22] Filed: May 9, 1988

[51] Int. Cl.$^4$ .............................................. G03C 1/72
[52] U.S. Cl. ..................................... 430/281; 430/914; 430/915; 430/916; 430/919; 430/920; 522/25; 522/26; 522/63
[58] Field of Search .............. 430/914, 916, 915, 281, 430/919, 920; 522/25, 26, 63

[56] References Cited

U.S. PATENT DOCUMENTS

| | | | |
|---|---|---|---|
| 3,932,446 | 1/1976 | Grychtol | 260/309 |
| 4,224,225 | 7/1980 | Noguchi et al. | 430/281 |
| 4,278,751 | 7/1981 | Specht et al. | 430/281 |
| 4,743,528 | 5/1988 | Farid et al. | 430/281 |
| 4,743,529 | 5/1988 | Farid et al. | 430/281 |
| 4,743,530 | 5/1988 | Farid et al. | 430/281 |
| 4,743,531 | 5/1988 | Farid et al. | 430/281 |

OTHER PUBLICATIONS

Chen et al. U.S. Ser. No. 191,948, filed May 9, 1988 and commonly assigned, titled Novel Benzofuran Dyes.
Farid et al. U.S. Ser. Nos. 933,712, 933,658, 933,660, and 933,657, all filed Nov. 21, 1986, and commonly assigned (Now issued as Farid et al. U.S. Pat. Nos. 4,743,528; 4,743,529; 4,743,530; and 4,743,531).

Primary Examiner—Paul R. Michl
Assistant Examiner—Thorl Chea
Attorney, Agent, or Firm—Carl O. Thomas

[57] ABSTRACT

A photographic imaging system is disclosed comprised of a hardenable organic component containing ethylenic unsaturation sites and coinitiators for ethylenic addition. The coinitiators include an activator and a photosensitizer. The photosensitizer is a 6-tertiary amino-2-(Z—CH=)benzofuran dye, where Z represents the atoms providing an electron withdrawing carbonyl or sulfonyl group and completing a conjugated methine linkage extending from the electron withdrawing carbonyl group through the benzofuran to the electron donating 6-tertiary amino substituent to form a resonant dye chromophore. The photosensitizers bathochromically extend exposure response of the imaging system.

26 Claims, No Drawings

DYE SENSITIZED PHOTOGRAPHIC IMAGING SYSTEMS

FIELD OF THE INVENTION

This invention relates to photography. More specifically, this invention relates to an imaging system which relies upon the hardening of organic component containing ethylenic unsaturation to produce an image pattern.

BACKGROUND OF THE INVENTION

A variety of photographic imaging systems are known wherein a hardenable organic component containing ethylenic unsaturation sites is relied upon for image formation. The organic component undergoes photoinduced addition reactions, typically either polymerization or crosslinking, at the ethylenic unsaturation sites which produce hardening and allow image discrimination to be achieved.

It is common practice in preparing these compositions to employ coinitiators. One of the coinitiators is an activator. Following exposure the activator is relied upon to release a free radical which in turn promotes an addition reaction at the sites of ethylenic unsaturation. The other coinitiator is a photosensitizer which enhances photon capture and transfer of photon energy to the activator. An important function of the photosensitizer is to extend the wavelength range of useful exposures for hardening. By employing a dye as a photosensitizer the wavelength region of response is shifted from the ultraviolet to the visible spectrum. Thus, an important function of a photosensitizer is to shift the wavelength of response of the imaging system bathochromically.

Among the most efficient dyes for use as photosensitizer coinitiators are coumarin dyes. Specht et al U.S. Pat. No. 4,278,751 discloses a ketocoumarin coinitiator for free radical polymerization having a maximum absorption in the 350 to 550 nm range containing a 7-amino substituent to the coumarin ring. The 7-amino substituent can complete a julolidene ring fused with the coumarin ring.

Grychtol U.S. Pat. No. 3,932,446 discloses a 6-aminobenzofuran dye which is substituted in its 2 position with a cyano group, a carboxy acid or ester group, or a electron donating nucleus, such as a benzoxazole, benzothiazole, or benzimidazole. The 6-aminobenzofuran dyes of Grychtol are fluorescent dyes. Since the energy these dyes receive is dissipated in the form of fluorescence, they are not efficient photosensitizers.

RELATED PATENT APPLICATIONS

Farid et al U.S. Ser. Nos. 933,712, 933,658, 933,660, and 933,657, all filed Nov. 21, 1986, now issued as U.S. Pat. Nos. 4,743,528, 4,743,529, 4,743,530, and 4,743,531, and commonly assigned, disclose hardenable compositions comprised of an organic compound containing ethylenic unsaturation, an azinium salt activator, and, acting as a photosensitizer, a dye having a reduction potential which is at most 0.1 more positive than the reduction potential of the azinium salt activator.

Chen et al U.S. Ser. No. 191,948, filed concurrently herewith and commonly assigned, titled NOVEL BENZOFURAN DYES, discloses novel 6-tertiary amino-2-(Z=CH—)benzofuran dyes and a novel procedure for their preparation.

SUMMARY OF THE INVENTION

In one aspect this invention is directed to a photographic imaging system comprised of a hardenable organic component containing ethylenic unsaturation sites and coinitators for ethylenic addition comprised of an activator and, acting as a photosensitizer, a 6-tertiary amino-2-(Z=CH—)benzofuran dye, where Z represents the atoms providing an electron withdrawing —C(O)— or —SO$_2$— group and a conjugated methine linkage completing a resonant dye chromophore including the 6-tertiary amino group as an electron donor and the electron withdrawing group as an electron acceptor.

The imaging systems of the present invention exhibit bathochromically extended useful exposure wavelengths. This is made possible by the incorporation of a photosensitizer containing having a bathochromically extended absorption peak. This permits efficient hardening with exposure sources, such as longer wavelength lasers, that could not be otherwise efficiently achieved. Inclusion of a tertiary amino substituent of the photosensitizer in the dye chromophore bathochromically shifts absorption as compared to otherwise structurally comparable dyes lacking the amino group.

DESCRIPTION OF PREFERRED EMBODIMENTS

It has been discovered that the wavelength response of photographic imaging systems which rely on activator and photosensitizer coinitiators for the hardening of an organic component containing ethylenic unsaturation can be improved by employing a 6-tertiary aminobenzofuran dye photosensitizer. As compared to imaging systems containing benzofuran dye photosensitizers lacking the 6-tertiary amino substituent longer wavelengths of imaging response are realized.

The photosensitizers contemplated for incorporation in the imaging systems of this invention are 6-tertiary aminobenzofuran dyes containing a novel chromophore produced by providing at the 2 position ring substituent satisfying the formula:

(I)

—CH=Z where Z represents the atoms providing an electron withdrawing carbonyl or sulfonyl group and a conjugated methine linkage completing a resonant dye chromophore including the 6-tertiary amino group as an electron donor and the electron withdrawing group as an electron acceptor.

The photosensitizers contain a resonant chromophore which can be represented by the resonance extremes:

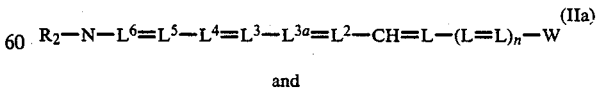

and

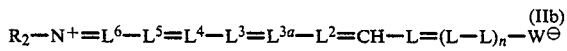

where

R$_2$ represent any convenient choice of substituents to complete a tertiary amine;

$L^2$, $L^3$, $L^{3a}$, $L^4$, $L^5$, and $L^6$ represent methine groups provided by the benzofuran nucleus, where the superscript corresponds the ring site at which the methine group is located;

=L—(L=L)$_n$—W corresponds to Z;

L is independently in each occurrence an optionally substituted methine group;

n is zero or a positive integer, typically 4 or less; and

W is an electron acceptor including a carbonyl or sulfonyl electron withdrawing group. In keeping with established practice, the various photosensitizers are named by reference to the uncharged resonance extreme represented by Formula IIa.

The photosensitizers of the present invention can be prepared by employing a 6-tertiary amino-2-formylbenzofuran as a starting material. The 6-tertiary amino-2-formylbenzofuran can be condensed with a precursor of Z at an active methyl or methylene site. In other words, the novel chromophore can be formed by the reaction:

(III)

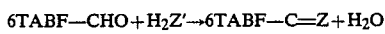

6TABF—CHO+H$_2$Z'→6TABF—C=Z+H$_2$O where

6TABF—CHO represents a 2-formyl-6-(tertiary amino)benzofuran and

H$_2$Z' is an active methyl or methylene precursor of Z. From the simplicity of the condensation reaction it is apparent that Z can take a wide range of forms permitting both the chromophore and the physical properties of the dye to be tailored to specific application requirements.

The description which follows is directed to certain preferred, illustrative forms of the photosensitizers. The terms "alkyl" and "aryl" are employed throughout to indicate substituents that can be widely varied. In general it is preferred to choose alkyl substituents from among those that contain 1 to 8 carbon atoms. Aryl substituents preferably contain from 6 to 10 carbon atoms-e.g., phenyl or naphthyl. To minimize molecular bulk lower alkyl groups (those containing from 1 to 3 carbon atoms-i.e., methyl, ethyl, and propyl) and phenyl groups are optimum substituent choices satisfying the alkyl and aryl substituent definitions, respectively.

In a preferred form the 2-(6-tertiary amino)benzofuranyl nucleus of the photosensitizer can be represented by the following formula:

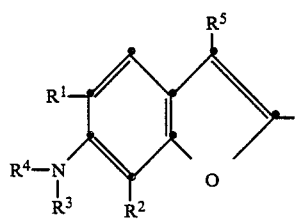

(IV)

where $R^1$, $R^2$, and $R^5$ each independently represent hydrogen, alkyl, or aryl and $R^3$ and $R^4$ each independently represent alkyl; or at least one of the substituent pairs represented by $R^1$ and $R^4$, $R^2$ and $R^3$, and $R^3$ and $R^4$ complete a 5 or 6 membered ring.

For example, $R^1$ and $R^2$ are preferably hydrogen when they are independent of the amino group, but substituent variations, such as, phenyl, methyl, ethyl, propyl, and the like are readily accomodated on the ring structure. $R^3$ and $R^4$, when present as independent substituents, are preferably alkyl, such as methyl or ethyl. $R^3$ and $R^4$ can together form any convenient 5 or 6 membered ring structure, such as morpholino or piperidino. Generally increased stability and bathochromic shifts in dye hue are realized when at least one of the two pairs represented by $R^1$ and $R^4$ or $R^2$ and $R^3$ combine to complete a 5 or 6 membered ring. Rings which contain the amino nitrogen atom as the sole heteroatom are preferred, such as pyrrole, pyrrolene, indole, indolene, and piperidene.

In a specifically preferred form of the benzofuran nucleus both the $R^1$ and $R^4$ and $R^2$ and $R^3$ substituent together form a julolidene group. While the julolidine groups are illustrated below as unsubstituted groups, it is appreciated that substituents are possible. For example, one or two benzo rings can be readily fused with the julolidine ring.

The present dyes are made possible by the discovery of processes for preparing the 2-formyl-6-(tertiary amino)benzofuran intermediate. When $R^5$ is hydrogen, the intermediates can be prepared by (1) condensation of a 2-hydroxybenzaldehyde having a nitrogen substituent in the 4-position with methyl bromoacetate and sodium hydride to produce the methyl ester of a 2-carboxybenzofuran, (2) reduction of the ester to the alcohol with lithium aluminum hydride, and (3) reoxidation of the alcohol to the aldehyde with manganese dioxide or p-chloranil.

The preparation is illustrated in the following reaction scheme:

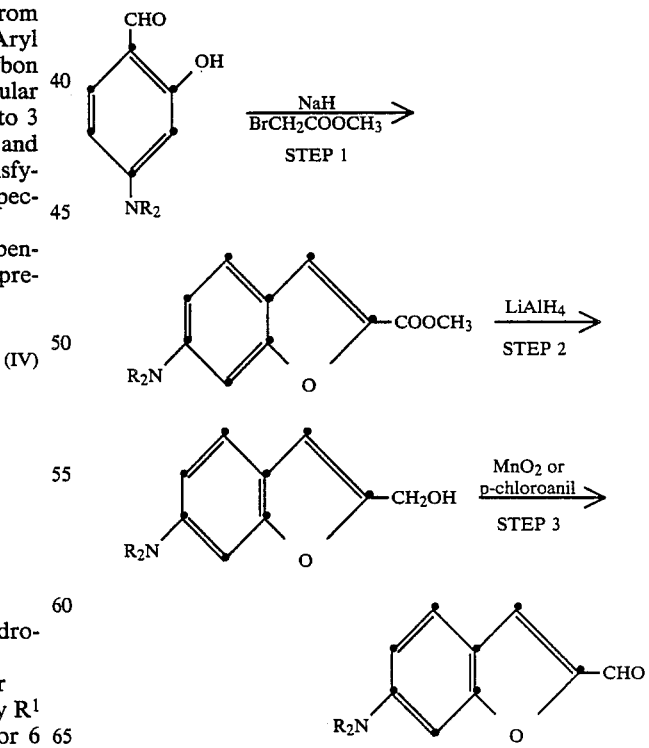

When $R^5$ is other than hydrogen—e.g., alkyl or aryl, the intermediates can be prepared by $L^2$, $L^3$, $L^{3a}$, $L^4$, $L^5$, and $L^6$ represent methine groups provided by the benzofuran nucleus, where the superscript corresponds the ring site at which the methine group is located;

=L—(L=L)$_n$—W corresponds to Z;

L is independently in each occurrence an optionally substituted methine group;

n is zero or a positive integer, typically 4 or less; and

W is an electron acceptor including a carbonyl or sulfonyl electron withdrawing group. In keeping with established practice, the various photosensitizers are named by reference to the uncharged resonance extreme represented by Formula IIa.

The photosensitizers of the present invention can be prepared by employing a 6-tertiary amino-2-formylbenzofuran as a starting material. The 6-tertiary amino-2-formylbenzofuran can be condensed with a precursor of Z at an active methyl or methylene site. In other words, the novel chromophore can be formed by the reaction:

(III)

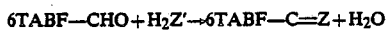

6TABF—CHO+H$_2$Z'→6TABF—C=Z+H$_2$O where

6TABF—CHO represents a 2-formyl-6-(tertiary amino)benzofuran and

H$_2$Z' is an active methyl or methylene precursor of Z. From the simplicity of the condensation reaction it is apparent that Z can take a wide range of forms permitting both the chromophore and the physical properties of the dye to be tailored to specific application requirements.

The description which follows is directed to certain preferred, illustrative forms of the photosensitizers. The terms "alkyl" and "aryl" are employed throughout to indicate substituents that can be widely varied. In general it is preferred to choose alkyl substituents from among those that contain 1 to 8 carbon atoms. Aryl substituents preferably contain from 6 to 10 carbon atoms-e.g., phenyl or naphthyl. To minimize molecular bulk lower alkyl groups (those containing from 1 to 3 carbon atoms-i.e., methyl, ethyl, and propyl) and phenyl groups are optimum substituent choices satisfying the alkyl and aryl substituent definitions, respectively.

In a preferred form the 2-(6-tertiary amino)benzofuranyl nucleus of the photosensitizer can be represented by the following formula:

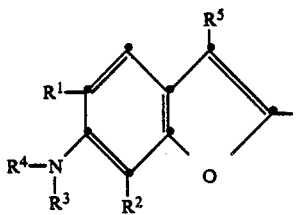

(IV)

where $R^1$, $R^2$, and $R^5$ each independently represent hydrogen, alkyl, or aryl and $R^3$ and $R^4$ each independently represent alkyl; or at least one of the substituent pairs represented by $R^1$ and $R^4$, $R^2$ and $R^3$, and $R^3$ and $R^4$ complete a 5 or 6 membered ring.

For example, $R^1$ and $R^2$ are preferably hydrogen when they are independent of the amino group, but substituent variations, such as, phenyl, methyl, ethyl, propyl, and the like are readily accomodated on the ring structure. $R^3$ and $R^4$, when present as independent substituents, are preferably alkyl, such as methyl or ethyl. $R^3$ and $R^4$ can together form any convenient 5 or 6 membered ring structure, such as morpholino or piperidino. Generally increased stability and bathochromic shifts in dye hue are realized when at least one of the two pairs represented by $R^1$ and $R^4$ or $R^2$ and $R^3$ combine to complete a 5 or 6 membered ring. Rings which contain the amino nitrogen atom as the sole heteroatom are preferred, such as pyrrole, pyrrolene, indole, indolene, and piperidene.

In a specifically preferred form of the benzofuran nucleus both the $R^1$ and $R^4$ and $R^2$ and $R^3$ substituent together form a julolidene group. While the julolidine groups are illustrated below as unsubstituted groups, it is appreciated that substituents are possible. For example, one or two benzo rings can be readily fused with the julolidine ring.

The present dyes are made possible by the discovery of processes for preparing the 2-formyl-6-(tertiary amino)benzofuran intermediate. When $R^5$ is hydrogen, the intermediates can be prepared by (1) condensation of a 2-hydroxybenzaldehyde having a nitrogen substituent in the 4-position with methyl bromoacetate and sodium hydride to produce the methyl ester of a 2-carboxybenzofuran, (2) reduction of the ester to the alcohol with lithium aluminum hydride, and (3) reoxidation of the alcohol to the aldehyde with manganese dioxide or p-chloranil.

The preparation is illustrated in the following reaction scheme:

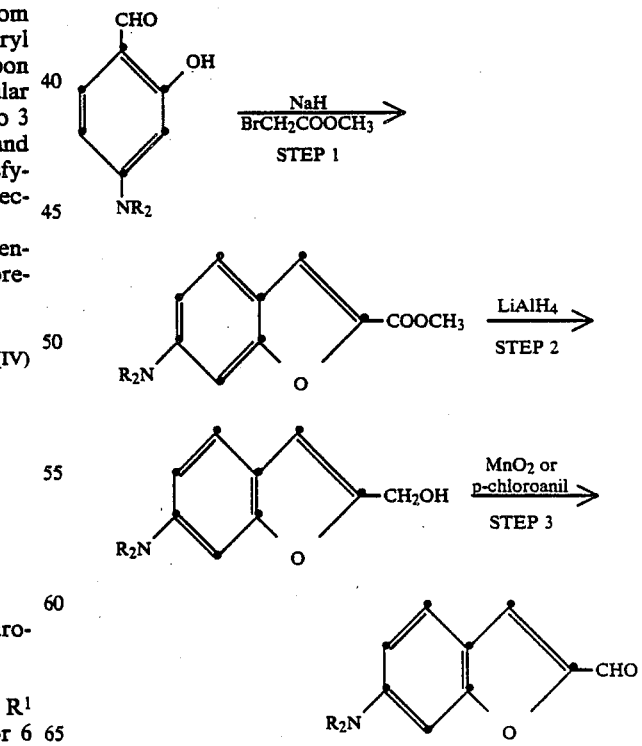

When $R^5$ is other than hydrogen—e.g., alkyl or aryl, the intermediates can be prepared by

DYE SENSITIZED PHOTOGRAPHIC IMAGING SYSTEMS

FIELD OF THE INVENTION

This invention relates to photography. More specifically, this invention relates to an imaging system which relies upon the hardening of organic component containing ethylenic unsaturation to produce an image pattern.

BACKGROUND OF THE INVENTION

A variety of photographic imaging systems are known wherein a hardenable organic component containing ethylenic unsaturation sites is relied upon for image formation. The organic component undergoes photoinduced addition reactions, typically either polymerization or crosslinking, at the ethylenic unsaturation sites which produce hardening and allow image discrimination to be achieved.

It is common practice in preparing these compositions to employ coinitiators. One of the coinitiators is an activator. Following exposure the activator is relied upon to release a free radical which in turn promotes an addition reaction at the sites of ethylenic unsaturation. The other coinitiator is a photosensitizer which enhances photon capture and transfer of photon energy to the activator. An important function of the photosensitizer is to extend the wavelength range of useful exposures for hardening. By employing a dye as a photosensitizer the wavelength region of response is shifted from the ultraviolet to the visible spectrum. Thus, an important function of a photosensitizer is to shift the wavelength of response of the imaging system bathochromically.

Among the most efficient dyes for use as photosensitizer coinitiators are coumarin dyes. Specht et al U.S. Pat. No. 4,278,751 discloses a ketocoumarin coinitiator for free radical polymerization having a maximum absorption in the 350 to 550 nm range containing a 7-amino substituent to the coumarin ring. The 7-amino substituent can complete a julolidene ring fused with the coumarin ring.

Grychtol U.S. Pat. No. 3,932,446 discloses a 6-aminobenzofuran dye which is substituted in its 2 position with a cyano group, a carboxy acid or ester group, or a electron donating nucleus, such as a benzoxazole, benzothiazole, or benzimidazole. The 6-aminobenzofuran dyes of Grychtol are fluorescent dyes. Since the energy these dyes receive is dissipated in the form of fluorescence, they are not efficient photosensitizers.

RELATED PATENT APPLICATIONS

Farid et al U.S. Ser. Nos. 933,712, 933,658, 933,660, and 933,657, all filed Nov. 21, 1986, now issued as U.S. Pat. Nos. 4,743,528, 4,743,529, 4,743,530, and 4,743,531, and commonly assigned, disclose hardenable compositions comprised of an organic compound containing ethylenic unsaturation, an azinium salt activator, and, acting as a photosensitizer, a dye having a reduction potential which is at most 0.1 more positive than the reduction potential of the azinium salt activator.

Chen et al U.S. Ser. No. 191,948, filed concurrently herewith and commonly assigned, titled NOVEL BENZOFURAN DYES, discloses novel 6-tertiary amino-2-(Z=CH—)benzofuran dyes and a novel procedure for their preparation.

SUMMARY OF THE INVENTION

In one aspect this invention is directed to a photographic imaging system comprised of a hardenable organic component containing ethylenic unsaturation sites and coinitators for ethylenic addition comprised of an activator and, acting as a photosensitizer, a 6-tertiary amino-2-(Z=CH—)benzofuran dye, where Z represents the atoms providing an electron withdrawing —C(O)— or —SO$_2$— group and a conjugated methine linkage completing a resonant dye chromophore including the 6-tertiary amino group as an electron donor and the electron withdrawing group as an electron acceptor.

The imaging systems of the present invention exhibit bathochromically extended useful exposure wavelengths. This is made possible by the incorporation of a photosensitizer containing having a bathochromically extended absorption peak. This permits efficient hardening with exposure sources, such as longer wavelength lasers, that could not be otherwise efficiently achieved. Inclusion of a tertiary amino substituent of the photosensitizer in the dye chromophore bathochromically shifts absorption as compared to otherwise structurally comparable dyes lacking the amino group.

DESCRIPTION OF PREFERRED EMBODIMENTS

It has been discovered that the wavelength response of photographic imaging systems which rely on activator and photosensitizer coinitiators for the hardening of an organic component containing ethylenic unsaturation can be improved by employing a 6-tertiary amino-benzofuran dye photosensitizer. As compared to imaging systems containing benzofuran dye photosensitizers lacking the 6-tertiary amino substituent longer wavelengths of imaging response are realized.

The photosensitizers contemplated for incorporation in the imaging systems of this invention are 6-tertiary aminobenzofuran dyes containing a novel chromophore produced by providing at the 2 position ring substituent satisfying the formula:

(I)

—CH=Z where Z represents the atoms providing an electron withdrawing carbonyl or sulfonyl group and a conjugated methine linkage completing a resonant dye chromophore including the 6-tertiary amino group as an electron donor and the electron withdrawing group as an electron acceptor.

The photosensitizers contain a resonant chromophore which can be represented by the resonance extremes:

$$R_2-N-L^6=L^5-L^4=L^3-L^{3a}=L^2-CH=L-(L=L)_n-W \quad \text{(IIa)}$$

and $$R_2-N^+=L^6-L^5=L^4-L^3=L^{3a}-L^2=CH-L=(L-L)_n-W^\ominus \quad \text{(IIb)}$$

where

R$_2$ represent any convenient choice of substituents to complete a tertiary amine;

(1) reacting o-aminophenol with $R^5$ bromomethyl ketone in the presence of potassium carbonate, (2) employing zinc chloride to effect ring closure by the elimination water, and (3) achieving formyl substitution by the Vilsmeir reaction employing phosphoryl chloride and dimethylformamide (DMF).

The preparation is illustrated in the following reaction scheme:

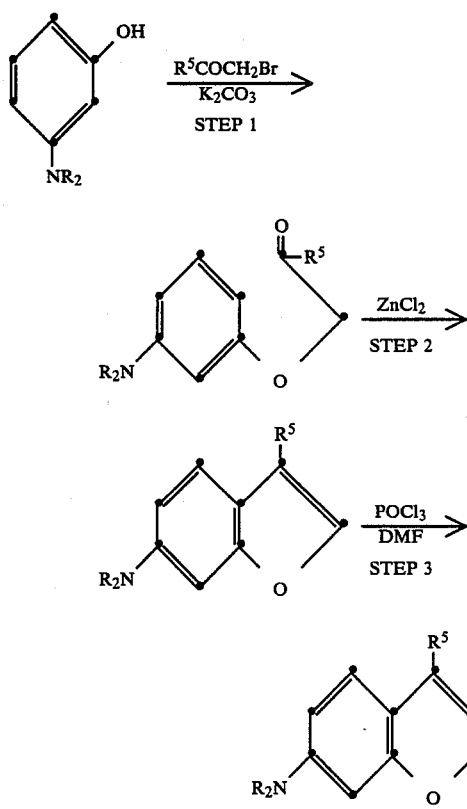

Although omitted for simplicity from the exemplary schematic reaction sequences, it is appreciated that in either synthetic approach $R^1$, $R^2$, $R^3$, and $R^4$ can be present and can take any of the forms described above.

Widely different choices of Z to complete the chromophore are possible. Exemplary preferred forms of photosensitizers satisfying the requirements of the invention are discussed.

In one preferred form the photosensitizers contain a coumarin nucleus. These photosensitizers can be represented by the formula:

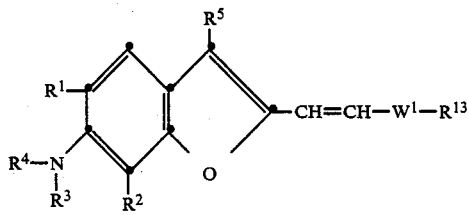

where $W^1$ represents

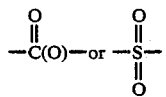

and $R^{13}$ represents a 3-coumarinyl group.

The coumarin nucleus can be selected from any of a variety of known forms, such as those diclosed in Specht et al U.S. Pat. No. 4,278,751 and published U. K. Spec. 3,083,832A, the disclosures of which are here incorporated by reference.

Preferred coumarin nuclei are those which are substituted in ring position 7 with an amino group, subsequently referred to as a 7-amino substituent. When the 7-amino substituent is a tertiary amine, it can form an extension of the dye chromophore in a manner similar to that described above in connection with 6-amino substituent of the benzofuranyl nucleus. Thus, the preferred 3-coumarinyl groups can be represented by the formula:

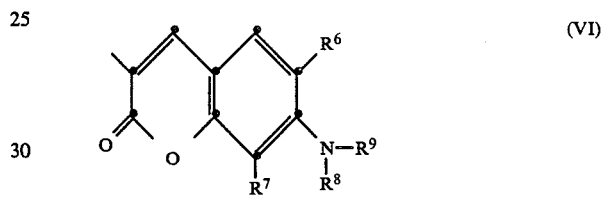

where $R^6$ and $R^7$ each independently represent hydrogen, alkyl, or aryl;

$R^8$ and $R^9$ each independently represent alkyl; or at least one of the substituent pairs represented by $R^6$ and $R^9$, $R^7$ and $R^8$, and $R^8$ and $R^9$ complete a 5 or 6 membered ring.

The preferences discussed above in connection with selections of $R^1$, $R^2$, $R^3$, and $R^4$ are applicable to selections of $R^6$, $R^7$, $R^8$, and $R^9$, respectively.

In another preferred form the photosensitizers can take the form of bis[2-(6-amino)benzofuranyl] photosensitizers in which the benzofuran nuclei share a common electron withdrawing moiety in the chromophore, such as W, described above. This again has the effect of lengthening and stabilizing the chromophore.

Exemplary bis[2-(6-amino)benzofuranyl] photosensitizers useful as coinitiators for free radical polymerization and crosslinking are those represented by the formula:

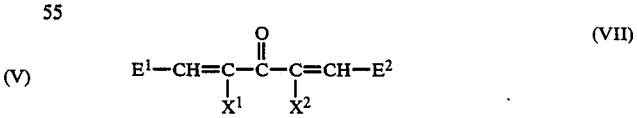

where $E^1$ and $E^2$ are independently 2-(6-amino)benzofuranyl groups and $X^1$ and $X^2$ are independently hydrogen, alkyl, or aryl or together complete a 5 to 7 membered ring.

When $X^1$ and $X^2$ are independently selected, forms such as hydrogen, phenyl, methyl, or ethyl are preferred.

When $X^1$ and $X^2$ together complete a 5 to 7 membered ring, they preferably complete a ring satisfying the formulae:

$$-(CH_2)_n- \quad \text{(VIII)}$$

or $$-(CH_2-Y-CH_2)- \quad \text{(IX)}$$

where n is 2 to 4;

Y is $-NR^{10}-$ or $-O-$; and $R^{10}$ is hydrogen, lower alkyl, or phenyl.

In the simplest form the ring can be a carbocyclic ring, such as cyclopentanone, cyclohexanone, or cycloheptanone. A functionally compatible heteroatom, such as nitrogen (e.g., —NH—) or oxygen (i.e., —O—), can be substituted for one or more of the ring carbon atoms. Preferred heterocyclic rings for these bis[2-(6-amino)-benzofuranyl] photosensitizers are those in which piperidin-4-one and tetrahydropyran-4-one rings form the central ring.

Another class of photosensitizers that has been investigated include in addition to the basic 2-(6-amino)benzofuranyl nucleus a furan-2-one-5-yl-idene nucleus. An example of such a nucleus containing both carbonyl and a cyano electron acceptor in the chromophore is represented by the following formula:

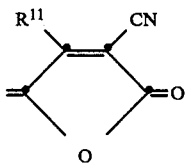

where $R^{11}$ is aryl, preferably phenyl.

There are, of course, numerous other potential acidic nuclei which can provide the electron acceptor portion of the photosensitizer chromophore. For example, the electron acceptor moiety W discussed above can take the form of an acidic nucleus of the type found in merocyanine dyes. In an illustrative form such photosensitizers can be represented by the formula:

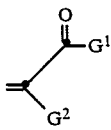

where $G^1$ represents an alkyl group or substituted alkyl group, an aryl or substituted aryl group, an aralkyl group, an alkoxy group, an aryloxy group, a hydroxy group, an amino group, or a substituted amino group, wherein exemplary substituents can take the various forms noted in connection with Formulae 1 and 2;

$G^2$ can represent any one of the groups listed for $G^1$ and in addition can represent a cyano group, an alkyl, or arylsulfonyl group, or a group represented by

or $G^2$ taken together with $G^1$ can represent the elements needed to complete a cyclic acidic nucleus such as those derived from 2,4-oxazolidinone (e.g., 3-ethyl-2,4-oxazolidindione), 2,4-thiazolidindione (e.g., 3-methyl-2,4-thiazolidindione), 2-thio-2,4-oxazolidindione (e.g., 3-phenyl-2-thio-2,4-oxazolidindione), rhodanine, such as 3-ethylrhodanine, 3-phenylrhodanine, 3-(3-dimethylaminopropyl)rhodanine, and 3-carboxymethylrhodanine, hydantoin (e.g., 1,3-diethylhydantoin and 3-ethyl-1-phenylhydantoin), 2-thiohydantoin (e.g., 1-ethyl-3-phenyl-2-thiohydantoin, 3-heptyl-1-phenyl-2-thiohydantoin, and arylsulfonyl-2-thiohydantoin), 2-pyrazolin-5-one, such as 3-methyl-1-phenyl-2-pyrazolin-5-one, 3-methyl-1-(4-carboxybutyl)-2-pyrazolin-5-one, and 3-methyl-2-(4-sulfophenyl)-2-pyrazolin-5-one, 2-isoxazolin-5-one (e.g., 3-phenyl-2-isoxazolin-5-one), 3,5-pyrazolidindione (e.g., 1,2-diethyl-3,5-pyrazolidindione and 1,2-diphenyl-3,5-pyrazolidindione), 1,3-indandione, 1,3-dioxane-4,6-dione, 1,3-cyclohexanedione, barbituric acid (e.g., 1-ethylbarbituric acid and 1,3-diethylbarbituric acid), and 2-thiobarbituric acid (e.g., 1,3-diethyl-2-thiobarbituric acid and 1,3-bis(2-methoxyethyl)-2-thiobarbituric acid).

Any of the activators known to be useful in dye sensitized free radical photopolymerization systems can be employed as activators in the imaging systems of this invention. A survey of useful activators for these imaging systems is set forth in Volman et al, *Advances in Photochemistry*, Vol. 13, in the chapter titled "Dye Sensitized Photopolymerization" by D. F. Eaton, pp. 427 to 488, John Wiley & Sons (1986). Useful activators include both electron donor activators and electron acceptor activators.

Disclosed classes of electron donor activators include amines, such as triethanolamine, hydrazine, 1,4-diazabicyclo[2.2.2]octane, tri-n-butylamine, tri-n-propylamine, triethylamine, benzylamine, N-methylpiperidine, quinuclidine, piperidine, pyrrolidine, diethylamine, triethanolamine, aniline, 4-bromoaniline, N-methylaniline, N,N-dimethylaniline, and triphenylamine (and its triphenylphosphine and triphenylarsine analogs); sulfur compounds, such as arylsulfinates; enolates of diketones, such as acetylacetone and 5,5-dimethyl-1,3-cyclohexanedione (also known as dimedone); allylthiourea; N-phenylglycine; and various azoles, including imidazole, oxazole, and thiazole; and various organometallic compounds, such as n—$C_3H_7Sn(CH_3)_3$, (allyl)Sn(CH_3)_3, and (benzyl)Sn(n—$C_4H_9)_3$. Dye borate electron donor activators of the type disclosed in published European Patent Application 0,223,587 A1 are also contemplated.

Electron acceptor activators include onium activators, such as ammonium, diazonium (e.g., phenyldiazonium salts optionally substituted with groups such as alkyl, alkoxy, halo, or nitro groups), sulfonium (e.g., optionally alkyl or alkoxy substituted triarylsulfonium salts including adjacent aryl nuclei with 2,2' oxy bridging groups), selenium salt analogues of the sulfonium activators, and iodonium salts (e.g., diphenyl and 2,2'-biphenyl iodonium salts optionally alkyl substituted).

Preferred electron acceptor activators are azinium activators, such as those disclosed by Heseltine et al and Jenkins et al U.S. Reissue Pat. Nos. 27,922 and 27,925, Specht and Farid U.K. 2,083,832A, and *Research Disclosure*, Vol. 200, Dec. 1980, Item 20036, provide a variety of examples of useful azinium activators.

The azinium activators include an azinium nucleus, such as a pyridinium, diazinium, or triazinium nucleus.

The azinium nucleus can include one or more aromatic rings, typically carbocyclic aromatic rings, fused with an azinium ring. In other words, the azinium nuclei include quinolinium, isoquinolinium, benzodiazinium, and naphthodiazonium nuclei. To achieve the highest attainable activation efficiencies per unit of weight it is preferred to employ monocyclic azinium nuclei.

A quaternizing substituent of a nitrogen atom in the azinium ring is capable of being released as a free radical upon electron transfer from the photosensitizer to the azinium activator. In one preferred form the quaternizing substituent is an oxy substituent. The oxy substituent (—O—T) which quaternizes a ring nitrogen atom of the azinium nucleus can be selected from among a variety of synthetically convenient oxy substituents. The moiety T can, for example, be an alkyl radical, such as methyl, ethyl, butyl, etc.. The alkyl radical can be substituted. For example, arakyl (e.g. benzyl and phenethyl) and sulfoalkyl (e.g., sulfomethyl) radicals are contemplated. In another form T can be an acyl radical, such as an —C(O)—$T^1$ radical, where $T^1$ can take any of the varied forms of alkyl and aralkyl radicals described above. In addition $T^1$ can be an aryl radical, such as phenyl or naphthyl. The aryl radical can in turn be substituted. For example, $T^1$ can be a tolyl or xylyl radical. T typically contains from 1 to 18 carbon atoms, with alkyl moieties in each instance above preferably containing from 1 to 8 carbon atoms and aryl moieties in each instance above containing 6 to 10 carbon atoms. Highest activity levels have been realized when the oxy substituent (—O—T) contains 1 or 2 carbon atoms.

The azinium nuclei need include no substituent other than the quaternizing substituent. However, the presence of other substituents is not detrimental to the activity of the activators. While it is known to include azinium nuclei substituents to increase blue light absorption by the activator directly, substituents capable of performing this function are not required.

It is a specific advantage of this invention that the dye photosensitizer can be relied upon for the absorption of light, and the azinium nuclei, apart from the quaternizing substituent, can be unsubstituted or, preferably, substituted with comparatively simple groups chosen for properties such as ease of synthetic or physical handling convenience, such as groups chosen from among substituted and unsubstituted aryl substituents of from 6 to 10 carbon atoms (e.g., phenyl or naphthyl) and substituted and unsubstituted alkyl and alkenyl groups of from 1 to 18 carbon atoms, preferably of from 1 to 8 carbon atoms. Activators free of a dye chromophore and therefore having limited ability to absorb visisble light offer the advantage of improved stability when exposed to light during synthesis and/or handling. For example, these activators remain stable when synthesized and handled in unfiltered room light.

Any convenient charge balancing counter-ion can be employed to complete the activator. Both weakly and highly dissociated counter-ions have been demonstrated to be useful. The counter-ion can be chosen for compatibility with the remaining components of the imaging system. For example, fluorinated carboxylate counter-ions, particularly perfluorinated carboxylate counter-ions, which are relatively undissociated, have been advantageously employed with azinium activators incorporated in oleophilic media, more specifically described below. Nevertheless, it is believed that highest levels of activity can be attributed to azinium activators which are ionically dissociated from charge balancing counter-ions in the imaging composition. While variances in ionic dissociation can be achieved by varied choices of solvents, film forming components, acidity, etc., in general higher levels of counter-ion dissociation occur with more electronegative counter-ions, such as hexafluorophosphate, tetrafluoroborate, perchlorate, para-toluenesulfonate, halide, sulfate, and similar electronegative anions.

In addition to activator and photosensitizer coinitiators it is additionally recognized that a third coinitiator, referred to as an enhancer, can optionally be included in the imaging composition. Aniline enhancers are disclosed in U.S. Ser. No. 933,657, filed Nov. 21, 1986, now U.S. Pat. No. 4,743,528 commonly assigned and cited above, titled Enhanced Imaging Composition Containing an Azinium Activator.

Since photon energy is first captured by the photosensitizer and then transferred to the activator, the potentials of the activator and photosensitizer should be chosen to facilitate this energy transfer. In general photosensitizer and electron acceptor activator combinations are chosen in which the photosensitizer has a reduction potential equal to or, preferably, more cathodic than that of the activator. In some instances the reduction potential of the photosensitizer can be slightly more positive than that of the activator. For example, it has been experimentally observed that photosensitizers having reduction potentials up to 0.1 volt more positive than azinium activators are nevetheless useful. Similarly, photosensitizer and electron donor activator combinations are chosen in which the photosensitizer has an oxidation potential more anodic, equal to, or up to 0.1 volt more negative than that of the electron donor activator.

In addition to the coinitiators described above the imaging system includes a hardenable organic component containing ethylenic unsaturation sites. Depending upon the application an imaging dye or dye precursor can also be included. In a simple illustrative form the hardenable organic component can take the form of an organic film forming component of a negative-working photoresist optionally having the imaging dye or its precusor blended therewith.

The organic film forming component can take the form of any containing ethylenic unsaturation and capable of selective immobilization by undergoing an addition reaction at the site of the ethylenic unsaturation. Hardening of the film forming component and thus immobilization of the blended imaging dye or dye precursor can be imparted by initiating polymerization of monomers containing ethylenic unsaturation or by initiating crosslinking of linear polymers or oligomers containing ethylenic unsaturation. For example, any of the monomeric or crosslinkable polymeric film forming components disclosed in Jenkins et al and Heseltine et al U.S. Reissue 27,925 or 27,922, respectively, are suitable for use in the photoresists of this invention and are here incorporated by reference. Tan et al U.S. Pat. No. 4,289,842, here incorporated by reference, discloses negative working photoresists containing light sensitive acrylate copolymers containing pendant groups, such as alkenyl groups with ethylenic unsaturation. Lindley U.S. Pat. No. 4,590,147, here incorporated by reference, discloses vinyl oligomers which can be employed as film forming components in the photoresists of this invention. Useful film forming components containing vinyl monomers are disclosed in Fuerniss U.S. Pat. No. 4,497,889 and Anderson et al U.S. Pat. No. 4,535,052, both here incorporated by reference. Kosar *Light-Sensitive Systems*, John Wiley & Sons, 1965, further describes a variety of useful film forming components for use in the practice of this invention, including ethylenically unsaturated monomers and polymers.

Preferred film forming components are comprised of at least one addition polymerizable ethylenically unsaturated compound having a boiling point above 100° C. at normal pressure which is preferably employed in combination with a polmeric binder. The ethylenically unsaturated compound (typically a monomer) and the polymeric binder can be employed together in widely varying proportions, including ethylenically unsaturated compound ranging from 3 to 97 percent by weight of the film forming component and polymeric binder ranging from 97 to 3 percent by weight of the film forming component. A separate polymeric binder, though preferred, is not an essential part of the film forming component and is most commonly omitted when the ethenically unsaturated compound is itself a polymer.

Chang U.S. Pat. No. 3,756,827, here incorporated by reference, discloses in column 2, line 36 to column 3, line 30, a variety of suitable organic monomers for use in the photoresists of this invention. Specifically illustrated in the examples below are ester monomers containing ethylenic unsaturation. Similar monomers include ethylenically unsaturated diester polyhydroxy polyethers, described in Chambers U.S. Pat. No. 4,245,031, here incorporated by reference.

Organic polymeric binders which can form a part of the film forming component of the photoresist include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers— e.g., poly(ethylene glycols), having weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation, such as polymerized forms of any of the various ethylenically unsaturated monomers, such as polyalkylenes—e.g. polyethylene and polypropylene; poly(vinyl alcohol); poly(vinyl esters)—e.g., poly(vinyl acetate); polystyrene; poly(acrylic and methacrylic acids and esters)—e.g., poly(methyl methacrylate) and poly(ethyl acrylate), as well as copolymer variants.

In addition to the film forming component and the coinitiators the negative-working photoresist can contain an imaging dye or an imaging dye precursor. The imaging dye or its precursor can be present in any concentration which imparts a visually discernable coloration to the photoresist when coated on a substrate, exposed to imaging radiation, and then developed. Useful imaging dye concentrations can vary widely, depending upon a variety of factors, such as the extinction coefficient of the dye, the degree of color saturation desired, the manner in which the dye is dispersed, and the dispersing medium.

To achieve highest levels of sensitivity it is generally preferred to choose the imaging dye or its precursor to avoid competition or interaction with the photosensitizer. For example, with an imaging dye present in the imaging system during imagewise exposure if the imaging dye absorbs at the same wavelength as the photosensitizer, the speed of the system is reduced to the extent that the imaging dye captures photons which would otherwise be captured by the photosensitizer. Therefore, it is apparent that the imaging dye, where present during imagewise exposure, is preferably chosen to exhibit a maximum absorption peak in a different portion of the spectrum than the photosensitizer. For instance a cyan (red absorbing) photosensitizer employed with a yellow (blue absorbing) imaging dye exhibits higher levels of sensitivity than when the imaging dye is also a cyan dye. Further, to reduce the possibility of interactions between the photosensitizer and the imaging dye, it is preferred that the imaging dye have an absorption peak at a shorter wavelength than the photosensitizer. With such a relationship the imaging dye is responding to higher energy (shorter wavelength) radiation than the photosensitizer and therefore not likely to interfere with the interaction of the photosensitizer and activator.

Subject to the above considerations imaging dyes can be selected from among the various known classes of dyes. The imaging dyes are preferably selected from among the more light stable dyes, such as azo dyes, anthracene dyes, and the like. The imaging dyes are preferably selected to remain substantially inert during the photohardening step.

In a specific preferred form of the invention, instead of incorporating an imaging dye in the photoresist an imaging dye precursor, such as a leuco dye or other chromogenic material described more specifically below in connection with more elaborate imaging systems, can be employed. The use of a dye precursor which is substantially colorless at the stage of imagewise exposure has the advantage that the dye precursor does not absorb exposing radiation and hence does not compete with the photosensitizer. In other words, higher levels of sensitivity can be realized when a dye precursor is employed for imaging as compared with an imaging dye. For example, an image dye which absorbs at the same wavelength as the photosensitizer does not compete with the photosensitizer for photons when a dye precursor is employed so that the image dye chromophore is not formed until after imagewise exposure has occurred.

In addition to the film forming component, the coinitiators, and the imaging dye or dye precursor the photoresists can contain any one or combination of known addenda, such as thermal inhibitors, supplemental colorants (e.g., pigments), plasticizers, fillers, etc. To facilitate coating on a substrate the photoresist is usually dispersed in a solvent to create a solution or slurry, the liquid being evaporatively removed after coating. Any solvent can be employed for this purpose which is inert toward the film forming components and addenda of the photoresist. Solvents can be chosen from among a wide variety of organic liquids, including N,N-dimethylformamide; N,N-dimethylacetamide; alcohols, such as methanol, ethanol, butanol, etc.; ketones, such as acetone, cyclohexanone, and butanone; esters, such as ethyl acetate and ethyl benzoate; ethers, such as tetrahydrofuran and dioxane; chlorinated aliphatic hydrocarbons, such as methylene chloride and 1,2-dichloroethane; aromatic hydrocarbons, such as benzene and toluene; and other common solvents, such as dimethyl sulfoxide, chlorobenzene, and various mixtures of solvents.

Any conventional ratio of activator to film forming component can be present in the photoresists of this invention. Activator concentrations are as a practical matter most conveniently specified in terms of moles of activator per gram of dry solids, the latter consisting of the film forming component and the minor amounts of various addenda, but excluding any liquid component introduced to facilitate coating. Typically from about $2 \times 10^{-5}$ to $25 \times 10^{-5}$, most preferably from about $5 \times 10^{-5}$ to $20 \times 10^{-5}$ mole of activator is present per gram of dry solids.

In the practice of the present invention the enhancer is an optional coinitiator, meaning that it need not be present or need not be present in an effective amount. However, it is generally preferred to incorporate the enhancer in any convenient effective amount. Typically from about 0.1 to 10 moles per mole of activator are employed. The use of larger amounts is, of course, possible.

The photosensitizer can be present in any concentration capable of increasing the response of the photoresist to visible light. While the photosensitizer concentration can vary widely, it is generally contemplated to photosensitize in concentrations ranging from about $5 \times 10^{-7}$ to $1 \times 10^{-4}$ mole per gram of dry solids. Preferred photosensitizer concentrations are in the range of from $10^{-6}$ to $5 \times 10^{-5}$ mole per gram of dry solids, with optimum concentrations generally being in the range of from about $2 \times 10^{-6}$ to $2 \times 10^{-5}$ mole per gram of dry solids.

The substrate onto which the photoresist is coated can take any convenient conventional form. For imaging, transparent and white reflective substrates are particularly advantageous; however, any substrate which does not exactly match the hue of image dye can be employed. Substrates such as glass, ceramic, metal, cellulose paper, fiberboard, semiconductor, or polymer substrates are illustrative. Specific substrates include alumina-blasted aluminum, anodized aluminum, alumina-blasted poly(ethylene terephthalate) film, poly(ethylene terephthalate) film, flame or electrostatic discharge treated poly(ethylene terephthalate) film, poly(vinyl alcohol)-coated paper, crosslinked polyester-coated paper, nylon, glass, cellulose acetate film, heavy paper, such as lithographic paper, and the like.

In perhaps their most commonly used form photoresists are coated in a fluid form on a substrate and evaporatively dried, usually with heating, to produce a uniform coating. Often, particularly in the manufacture of semiconductor devices, the substrate is spun, thereby employing centifugal forces to assure the uniformity of the photoresist coating before drying. After exposure to visible radiation causes addition to occur at the ethylenic unsaturation sites of the film forming component, a liquid developer is brought into contact with the coated substrate to remove selectively the photoresist in areas which were not exposed to actinic radiation.

The liquid developer can be any convenient liquid which is capable of selectively removing the photoresist in unexposed areas. The coated photoresist can be sprayed, flushed, swabbed, soaked, or otherwise treated with the developer to achieve selective removal. In its simplest form the liquid developer can be the same liquid employed as a solvent in coating the photoresist. Methoxyethyl acetate and ethoxyethyl acetate are common developers. Also aqueous developers are commonly employed, such as miscible combinations of water and alcohols, with proportions in the range of from 20 to 80 percent water and 80 to 20 percent alcohol being common. Exemplary water miscible alcohols include glycerol, benzyl alcohol, 1,2-propanediol, sec-butyl alcohol, and ethers derived from glycols, such as dihydroxy poly(alkylene oxides). Lactone developers, such as those disclosed by Martinson et al U.S. Pat. No. 3,707,373, can be employed. Optimum developer choices for specific photoresists are disclosed in the various patents cited above illustrating the specific film forming components.

Following development a retained dye image is presented by the photoresist coating remaining on the substrate. The colored areas correspond to the areas of exposure. Multicolor images, such as images employed for color proofing, can be produced by superimposing three elements each comprised of a transparent support and a photoresist image, where each image is formed by a different additive or subtractive primary dye.

In the foregoing imaging systems only a single coated layer is required for imaging. However, it is recognized that the imaging systems of the invention can employ multiple layers. For example, instead of blending the imaging dye with the film forming component as described above, a separate imaging dye layer can be coated between the substrate and the photoresist layer. Upon imagewise exposure and development the photoresist is removed in exposed areas. Where the photoresist remains the underlying image dye remains in its initial immobilized condition, while in other areas the dye can be removed or decolorized by washing or any other convenient technique.

Instead of forming retained dye images with photoresist coatings as described above, it is specifically contemplated to form transferred dye images. For example, instead of removing the film forming component of the photoresist layer in unexposed areas by development following imagewise hardening, the unhardened areas of the photoresist layer or only the imaging dye or dye precursor contained in these areas can be selectively transferred to a receiver. For example, the greater tackiness of the unhardened areas can be relied upon to permit their transfer by first laminating the imagewise exposed layer to a receiver sheet and then stripping. In another approach, the hardened portions of the imagewise exposed layer can be relied upon to reduce the mobility of the image dye or dye precursor so that imaging dye is transferred to or formed in the receiver only in areas corresponding to unexposed areas of the photoresist layer. Other variant approaches to forming transferred images should be apparent from the description of other imaging systems below.

In the foregoing description of photoresists the hardenable organic component containing ethylenic unsaturation sites is a film forming component. However, in certain preferred imaging systems of the invention the hardenable organic component can be present as a discontinuous or internal phase forming microcapsules which can be in contact with a surrounding continuous phase or separated therefrom by intervening rupturable encapsulating walls. While it is possible to coat microcapsules each containing the hardenable organic component, coinitiators, and imaging dye or dye precursor to form a single color image, the present invention makes possible the formation of multicolor images employing a single layer of microcapsules coated on a support. Since the microcapsules form discrete packets of materials, it is possible to mix in the same layer microcapsules containing dye photosensitizers which absorb at differing locations in the visible spectrum and imaging dyes (or their precursors) of differing imaging hues. For example, it is contemplated to coat as a single layer on a substrate (a) microcapsules containing a yellow dye photosensitizer and a yellow or blue imaging dye or its precursor, (b) microcapsules containing a magenta dye photosensitizer and a magenta or green imaging dye or its precursor, and (c) microcapsules containing a cyan dye photosensitizer and a cyan or red imaging dye or its precursor. Except for the choice of dye photosensitizer and imaging dye the microcapsules can be otherwise identical. Thus, merely by blending three differing populations of microcapsules it is possible to obtain multicolor images with the same ease and facility as monochromic dye images are obtained. Except for hue selection of components and blending of microcapsule populations prior to coating, monochromic and multicolor imaging according to this invention are identical. Therefore, for simplicity the description which follows is in terms of monochromic imaging, but the description is applicable to both monochromic and multicolor imaging, except as specifically noted.

The microcapsules can be employed to produce either a retained or a transferred dye image. Further, either a preformed dye or, preferably, a dye precursor can be contained in the microcapsules.

In the retained imaging system a receiver layer is coated on a substrate and is overcoated by a layer of microcapsules. Within each coated microcapsule exposure to light which is absorbed by the dye photosensitizer results in release of a free radical by the azinium activator which in turn results in hardening of the organic component containing ethylenic unsaturation. Subsequent uniform rupture of all the coated microcapsules, as by passing the exposed element between pressure rollers, results in migration of imaging dye or its precursor from the microcapsules which were not exposed and hence were not internally hardened.

The released dye or dye precursor diffuses into the receiver layer. Where an imaging dye is contained in the microcapsules, the receiver layer can be formed of any convenient transparent dye penetrable material. For example, the dye can enter a hydrophilic colloid layer or film forming polymer layer. Preferably a mordant is present in the receiver layer to immobilize the image dye on receipt.

When the microcapsules contain a dye precursor, the dye image forming layer contains a second component capable of interacting with the dye precursor to form the image dye. One of the two components is hereinafter referred to as a chromogenic material and the other is referred to as a developer. Either or both can be viewed as a dye precursor and either can be located within the microcapsules with the other located in the dye image forming layer in monochromic imaging. However, for multicolor imaging the chromogenic materials, which differ based on the hue of the dye to be produced, are located within the microcapsules. For simplicity subsequent discussion is directed to chromogenic materials contained in the microcapsules with developer being located in the receiver layer, but the converse arrangement is possible, except as specifically noted. The receiver layer can be similar to the receiver for a preformed imaging dye, differing only by the additional inclusion of a developer.

Transferred dye image systems can be similar to the retained dye image systems described above, but differ in the location of the receiver layer. Instead of coating the receiver layer on the same support as the microcapsules, the receiver layer is coated on a separate support. In integral format arrangements the receiver layer and its support can be associated with the microcapsule layer and its support at the time of exposure as well as at the time transfer to the receiver from the microcapsules occurs. Alternatively, the receiver layer and its support need not be associated with the microcapsule layer until rupture of the microcapsules occurs. In either arrangement the receiver layer and its support can be employed alone as the image bearing element or can be retained with the microcapsule layer and its support. In the latter instance the decolorization of the photosensitizer by room light in the image bearing element and the initially colorless form of the chromogenic material are particularly advantageous.

In general similar materials can be employed in forming the microcapsule systems described above as have been previously described in connection with negative-working photoresists, the principal difference being in the physical continuity of the imaging layer. However, certain materials described below have been found to be particularly well suited to use in microcapsule imaging systems and constitute preferred materials.

Preferred hardenable organic components containing ethylenic unsaturation include compounds containing at least one terminal ethylenic group per molecule and preferably two or more terminal ethylenic groups per molecule. Typically they are liquid and can also double as a carrier oil for the chromogenic material in the internal phase. Representative examples of these compounds include ethylenically unsaturated acid esters of polyhydric alcohols such as trimethylol propane triacrylate. Another preferred hardenable component can include an acrylate prepolymer derived from the partial reaction of pentaerythritrol with acrylic acid or acrylic acid esters. Such materials are available from Richardson Company, Melrose Park, Ill.—e.g., R1-1482 and R1-1483. Also useful are isocyanate modified acrylate, methacrylate, and itaconic acid esters of polyhydric alcohols, such as disclosed by Carlick et al U.S. Pat. Nos. 3,825,479; 3,759,809; and 3,783,151.

The chromogenic materials used in the present invention are preferably oil soluble color formers which produce a dye upon reaction with a developer in the presence of a carrier oil. Representative examples of such chromogenic materials include substantially colorless compounds including a lactone, lactam, sultone, spiropyran, ester, or amido structure. Specifically preferred chromogenic materials are triarylmethane, bisphenylmethane, xanthene, thiazine, spiropyran, and similar compounds. Also useful as chromogenic materials are organic compounds capable of complexing with heavy metals to form dyes—e.g., copper phthalocyanine. Specific chromogenic materials, including specific additive and subtractive primary dye forming chromogenic materials, are disclosed in U.S. Pat. Nos. 3,920,510; 4,399,209; and 4,440,846, here incorporated by reference.

In addition to the hardenable organic component, the coinitiators, and the chromogenic material, the discrete phase or microcapsules can also contain a carrier oil. Preferred carrier oils are weakly polar solvents having boiling points above 170° C. and preferably in the range of from 180° C. to 300° C. Exemplary carrier oils include alkylated biphenyls (e.g., monoisopropylbiphenyl), polychorinated biphenyls, caster oil, mineral oil, deodorized kerosene, naphthenic mineral oils, dibutyl phthalate, dibutyl fumerate, brominated paraffin, and mixtures thereof. Alkylated biphenyls are preferred on the basis of low toxicity while brominated paraffins employed in combination with trimethylol propane triacrylate are particularly preferred for halftone imaging.

Carrier oils are not required. As previously noted the hardenable organic component can in many instances perform the mobility providing function of a carrier oil, particularly where the hardenable organic component is a monomer. The choice of carrier oil will depend to some extent on the chromogenic material to be transported on rupture of the microcapsule. Carrier oils are chosen on the basis of their ability to impart mobility to the chromogenic material in the absence of hardening of the organic component containing ethylenic unsaturation as well as being nonreactive with the various components of the microcapsules.

The internal phase forming the microcapsules is then comprised of the hardenable organic component, an optional carrier oil, a chromogenic material, coinitiators, and any of a variety of optional components intended to offer improvement in imaging properties, such as light scattering materials, stabilizers, and the like.

The materials forming the internal phase of the microcapsules can be present in generally similar concentration ranges as previously described in connection with photoresists. In general the hardenable organic component constitutes at least about 40 percent by weight of the internal phase and typically constitutes from about 50 to 99 percent by weight of the internal phase. The chromogenic material can be present in any concentration compatible with providing a visible dye image. In general useful concentrations range from about 0.5 to 20.0 percent by weight, based on the weight of the internal phase. A preferred range of chromogenic material for monochromic imaging is from about 2 to 7 percent by weight of the internal phase. In multicolor imaging a somewhat higher concentration of chromogenic material is preferred, since only a third of the microcapsules are available to provide a maximum image dye density of any primary hue. For example, a maximum density magenta image must be formed using only the one third of the microcapsules containing the chromogenic material which forms a magenta dye. A preferred range of chromogenic material for multicolor imaging is from about 5 to 15 percent by weight of the internal phase. Carrier oils are not required, but can be present in concentrations of up to about 50 percent by weight of the internal phase, preferably in concentrations of from about 10 to 40 percent of the internal phase. The coinitiators can be present in the same concentrations set out above for the photoresists, where the dry solids percentage bases correspond to internal phase percentage bases for the microcapsule utility.

In preferred forms the microcapsules each include in addition to the internal phase a rupturable surrounding encapsulating wall. Encapsulation can be undertaken in any convenient conventional manner. Oil soluble chromogenic materials have been encapsulated in hydrophilic wall forming materials, such as gelatin and gelatin derivatives (e.g., phthalated gelatin), gum arabic, poly(-vinyl alcohol), and carboxymethylcellulose wall forming materials, as illustrated by Green et al U.S. Pat. Nos. 2,730,456 and 2,800,457; resorcinol-formaldehyde wall formers, as illustrated by Vassiliades U.S. Pat. No. 3,914,511; isocyanatepolyol wall formers, as illustrated by Kiritani et al U.S. Pat. No. 3,796,669; urea-formaldehyde wall formers, particularly urea-resorcinol-formaldehyde wall formers, as illustrated by Foris et al U.S. Pat. Nos. 4,001,140, 4,087,376, and 4,089,802; melamineformaldehyde resin wall formers; and hydroxypropyl celluslose wall formers, as illustrated by Shackle U.S. Pat. No. 4,025,455; all of the forgoing patents being here incorporated by reference. The wall formers must, of course, be capable of transmitting exposing radiation. Preferred wall formers are gelatin and gelatin derivatives as well as urea-resorcinol-formaldehyde wall formers. Microencapsulation can be accomplished by any convenient conventional technique, including coacervation, interfacial polymerization, polymerization of one or more monomers in oil, as well as various melting dispersing, and cooling methods.

The microcapsules normally are chosen to be of a size too small to be individually discerned by the unaided eye. The microcapsules preferably range from about 1 to 25 micrometers ($\mu$m) in diameter, more typically from about 3 to 15 $\mu$m in diameter, depending upon the sharpness of the image desired, the smoothness of the support surface, and the technique used for rupturing the microcapsules. Generally the sharpness of the dye image increases as the size of microcapsules decreases. However, smaller microcapsules are less easily coated on rough surface supports and less easily ruptured uniformly by mechanical techniques.

The microcapsules are normally coated at a density sufficient to at least cover the surface of the support. That is, based on the average diameter of the microcapsules the coating coverage is chosen to provide at least a monolayer coverage of microcapsules on the support.

Instead of forming the microcapsules with discrete walls, it is appreciated that microcapsule containing compositions suitable for coating on a substrate can be produced by forming an emulsion in which the microcapsules constitute the discontinuous or internal phase and a binder analogous to the wall formers above constitutes the continuous phase. For example, such microcapsule coatings can be formed employing hydrophilic binders, such as hardened gelatin and gelatin derivatives.

Reacting with the chromogenic material (or first dye precursor) is a developer (or second dye precursor). The developer can take the form of any material capable of reacting with the chromogenic material to produce a dye. For the preferred classes of chromogenic materials identified above illustrative developers include clay minerals, such as acid clay, and active clay attapulgite; organic acids such as tannic acid, gallic acid, and propyl gallate; acid polymers, such as phenol-formaldehyde resins; condensates of carboxylic acids containing at least one hydroxy group and formaldehyde; metal salts of aromatic carboxylic acids, such as zinc salicylate, tin salicylate, zinc 2-hydroxynaphthenoate, zinc 3,5-di-tert-butylsalicylate; oil soluble metal salts of phenol-formaldehyde novolak resins (more specifically illustrated by U.S. Pat. Nos. 3,672,935; 3,732,120; and 3,737,410), zinc carbonate, and mixtures of the above.

When the developer is coated on a substrate, as is preferred, the developer is typically dispersed in a binder. The binder is chosen to be a relatively dye permeable inert material, such as poly(vinyl alcohol), gelatin or a gelatin derivative, maleic anhydride-styrene copolymer, starch, gum arabic, or a cellulose ester. In general well known film forming binders are useful. As mentioned above, a mordant can be incorporated in the binder for the developer to assist in immobilizing the dye once it is formed. A variety of mordants particularly compatible with gelatin and gelatin derivatives are disclosed by Hartman U.S. Pat. No. 4,315,978.

While the microcapsule containing imaging system has been described above in terms of employing a chromogenic material and a developer, it is appreciated that mobile imaging dyes can be substituted for the chromogenic material, if desired. The advantage of employing chromogenic materials is that the chromogenic material need contain no chromophore to compete with the dye photosensitizer for photon dye capture. Further, the chromogenic material minimizes coloration of the imaging system in areas where no image dye is formed.

While the preferred microcapsule imaging systems above have been described in terms of forming a discontinuous oleophilic phase in a continuous hydrophilic phase, it is appreciated that the reverse relationship is also possible. It is specifically contemplated to form microcapsules containing dyes or chromogenic materials which are more hydrophilic and to rely on the relative hydrophobicity if not impermeability of the microcapsule walls to initially confine the dyes. Where microcapsule wall formers are present, the same relatively hydrophilic binders described above can still be employed. The important point to note is that an extremely broad range of imaging dyes and chromogenic materials are available for use. Hartman U.S. Pat. No. 4,315,978 illustrates a variety of yellow, magenta, and cyan dyes containing polar substituents to impart mobility in more hydrophilic media.

While the invention has been described above in terms of forming dye images, it is appreciated that negative-working photoresist compositions often include no colorant or colorant precursor, since their primary purpose is to define a protective image rather than an image that is intended for viewing.

An illustration of a negative-working resist application of the invention which requires no incorporated image dye or image dye precursor is provided by a tape assisted bonding application of the invention. As disclosed by Guild U.S. Pat. No. 4,247,623, a useful intermediate article for packing integrated circuits is a tape having a metal layer laminated between a positive-working photoresist layer and a negative-working photoresist layer. Since the negative-working photoresist acts as a support for beam leads for the integrated circuit package formed from the metal layer, it is chosen to exhibit desirable dimensional stability and hardness at temperatures of 200° C. and higher. Binders are therefore chosen for the photoresist having a glass transition temperature of at least 150° C. Examples of useful polymeric binders known to have thermal properties compatible with the above requirements include polyacrylates, polyamides, polycarbonates, polyesters, polyesteramides, polyimides. Preferred binders are those disclosed in U.S. Pat. No. 4,322,490. Further details of preferred negative-working photoresists for this application are set out in Klein et al U.S. Ser. No. 77,714, filed Jul. 24, 1987, commonly assigned now U.S. Pat. No. 4,792,517.

EXAMPLES

The invention can be better appreciated by reference to the following specific examples.

Example 1

Preparation of 9-Formyl-2,3,6,7-tetrahydro-1H,5H-benzo[i,j]furano[3,2-g]-quinolizine

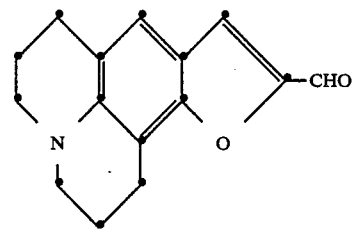

Step 1: Preparation of Methyl 2,3,6,7-Tetrahydro-1H,5H-benzo[i,j]furano[3,2-g]quinolizin-9-carboxylate To a 250 mL three-necked round-bottom flask equipped with a mechanical stirrer, reflux condenser, and Y-tube with nitrogen inlet and rubber septum was added 1.8 gm (45 mmol) of 60% NaH in mineral oil. After washing twice with reagent hexanes, 150 mL of distilled tetrahydrofuran (THF) was added to the flask, followed by the rapid addition, with vigorous stirring, of 4.34 gm (20 mmol) of 9-formyl-8-hydroxyjulolidine in 50 mL of THF. The flask was then placed in an 80° C. oil bath and stirred for several minutes. To the suspension was added in one portion 2.08 mL (22 mmol) of methyl bromoacetate. Sodium bromide precipitated from solution and vigorous stirring had to be maintained. The mixture was refluxed for 8 hours, allowed to cool to room temperature and diluted with 50 mL of diethyl ether.

The reaction was quenched by slow addition of 50 mL of dilute $NH_4Cl$ solution. The phases were separated and the aqueous phase extracted with 50 mL of $Et_2O$. The combined organic phases were washed with 25 mL of 1 N NaOH. After washing with water and drying ($MgSO_4$), the solvent was removed by rotary evaporation to yield as a yellow oil. The residue was purified by flash chromatography ($CH_2Cl_2$, $SiO_2$, 1¼×10″) to yield 3.03 gm (56%) of the product as a colorless oil: Field desorption mass spectrum: m/e 271 (M+). $^1H$ 270 NMR ($CDCl_3$): δ 1.98 (m, 4H, $CH_2CH_2CH_2$), 2.90 (t, 4H, $ArCH_2$), 3.21 (q, 4H, $NCH_2$), 3,87 (s, 3H, $OCH_3$), 7.02 (s, 1H, C=CHAr), 7.29 (s, 1H, ArH).

Step 2: Preparation of 9-Hydroxymethyl-2,3,6,7-tetrahydro-1H,5H-benzo[i,j]furano[3,2-g]quinolizine To a rapidly stirring suspension of 0.21 gm (5.5 mmol) of lithium tetrahydridoaluminate in 50 mL of distilled THF was added dropwise over 10 minutes 3.03 gm (11 mmol) of the compound of Step 1 in 25 mL of distilled THF. After stirring for 90 minutes at room temperature, 5 mL of ethyl acetate was added dropwise, followed by the addition of 50 mL of water. The phases were separated. The aqueous phase, which contained the insoluble aluminum salts, was extracted with 50 mL of $Et_2O$ and the combined organic phases were washed with 20 mL saturated NaCl solution. After drying ($MgSO_4$), the solvent was removed by rotary evaporation to yield 2.4 gm (89%) of the product as a colorless oil: Field desorption mass spectrum: m/e 245 (M+). $^1$H 270 NMR (CDCl$_3$): δ 1.7 (s, 1H, OH), 4.66 (s, broad, 2H, CH$_2$OH), 6.43 (s, 1H, C=CHAr), 7.24 (s, 1H, ArH).

Step 3: Preparation of 9-Formyl-2,3,6,7-tetrahydro-1H,5H-benzo[i,j-]furano[3,2-g]quinolizine of

Step 1

The compound from step 2 [2.4 gm (10 mmol)] was dissolved in 50 mL of chloroform and placed in a 200 mL three-necked round-bottom flask equipped with a heavy solvent water separator, reflux condenser apparatus, a glass stopcock, and mechanical stirrer. 1.7 gm (20 mmol) of active manganese dioxide was added and the suspension refluxed for 1 hour. The heat was removed and an additional 1.7 gm of MnO$_2$ was added. This sequence of MnO$_2$ addition and hour-long refluxing was continued until the reaction was complete by monitoring with thin layer chromatography (3:1 hexanes/EtOAc). The reaction was complete after 5 hours, during which time 8.5 gm (100 mmol, 10 equivalents) of additional manganese dioxide had been added. The product was isolated as follows: A ¼ inch layer of silica gel was placed in a 60 mL course sintered glass funnel and placed on a 500 mL vacuum flask. The chloroform suspension was poured through the silica gel under vacuum and the silica gel was washed with 300 mL of dichloromethane. The solvent was removed by rotary evaporation and the resulting residue recrystallized from 40 mL of ethyl acetate to yield 1.48 gm (62%) of the desired product as yellow flakes: Field desorption mass spectrum: m/e 241 (M+); m.p. 140°–141° C. Anal. calcd. for C$_{15}$H$_{15}$NO$_2$: C, 74.7; H, 6.3; N, 5.8 . Found: C, 74.7; H, 6.3; N, 5.8. $^1$H 270 NMR (CDCl$_3$): δ 7.08 (s, 1H, C=CHAr), 7.33 (s, 1H, ArH), 9.53 (s, 1H, CHO). An additional 220 mg was recovered in a second recrystallization from ethyl acetate for an overall yield of 69%.

Example 2

Preparation of 6-(N,N-Diethylamino)-2-formylbenzo[b]furan

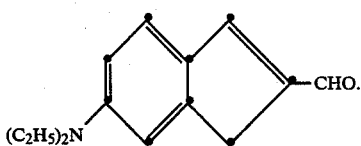

Step 1: Preparation of Methyl 6-(N,N-diethylamino)-2-benzo[b]furanylcarboxylate To a 250 mL three-necked, round-bottom flask equipped with a mechanical stirrer, reflux condenser, and Y-tube with a rubber septum and nitrogen inlet was added 1.8 gm (45 mmol) of 60% sodium hydride in mineral oil. After washing twice with 20 mL of hexanes, 150 mL of THF was added, followed by the rapid dropwise addition via transfer syringe of 3.86 gm (20 mmol) of 4-(N,N-diethylamino)-2-hydroxybenzaldehyde, dissolved in 50 mL of tetrahydrofuran (THF). The flask was placed in an 80° C. oil bath and stirred vigorously for 5 minutes, at which time 2.08 mL (20 mmol) of methyl bromoacetate was added in one portion. Sodium bromide precipitated from solution and vigorous stirring had to be maintained throughout. The suspension was refluxed for 80 minutes, allowed to cool to room temperature, and diluted with 75 mL of diethyl ether. The reaction was quenched by the slow dropwise addition of 50 mL of dilute aqueous ammonium chloride. The phases were separated and the aqueous phase extracted with 100 mL of diethyl ether (Et$_2$O). The combined organic phases were washed with 20 mL 1 N NaOH and 20 mL water. After drying (MgSO$_4$), the solvent was removed by rotary evaporation and the residual oil purified by flash chromatography (CH$_2$Cl$_2$; SiO$_2$, 1½×15″) to yield 2.23 gm (45.3%) of the product as a colorless oil. Field desorption mass spectrum: m/e 247 (M+). Anal. calcd. for C$_{14}$H$_{17}$NO$_3$: C, 68.0; H, 6.9; N, 5.7. Found: C, 67.9; H, 6.8; N, 5.8. $^1$H 270 NMR (CDCl$_3$): δ 6.7 (m, 2H, ArH$_{a,b}$), 7.4 (m, 2H, ArH$_{c,d}$).

Step 2: Preparation of 6-(N,N-diethylamino)-2-hydroxymethylbenzo[b]furan

To a rapidly stirring suspension of lithium tetrahydridoaluminate in 100 mL of THF was added dropwise over 10 minutes 12.4 gm (50 mmol) of Step 1 of this example compound dissolved in 50 mL of ethyl acetate was added dropwise and the resulting mixture was stirred for 10 minutes. The solution was diluted with 75 mL of Et$_2$O and 50 mL of water. The phases were separated, and the aqueous phase, which contained the insoluble aluminum salts, was extracted with 50 mL of Et$_2$O. The combined organic phases were washed with 50 mL saturated NaCl solution, dried (MgSO$_4$), and the solvent removed by rotary evaporation to yeild 9.0 gm (82%) of 4b as a pale yellow oil. Purification of an analytical sample by flash chromatography (CH$_2$Cl$_2$; SiO$_2$, 1×10″) yielded the product as a colorless oil. Field desorption mass spectrum: m/e 219 (M+). Anal. calcd. for C$_{13}$H$_{17}$NO$_2$: C, 71.2; H, 7.8; N, 6.4. Found: C, 70.8; H, 7.6; N, 6.1. $^1$H 270 NMR (CDCl$_3$): δ 2.2 (s, 1H, OH), 4.62 (s, 2H, CH$_2$OH), 6.45 (d, 1H, ArH), 6.66 (dd, 1H, ArH), 6.74 (d, 1H, ArH), 7.28 (d, 1H, ArH).

Step 3: Preparation of 6-(N,N-Diethylamino)-2-formylbenzo[b]furan

To a 50 mL round-bottomed flask equipped with a magnetic stirrer and reflux condensor was added 21.9 gm (0.1 mol) of the compound of Step 2 of this example, 500 mL of dry carbon tetrachloride, and 27.0 gm (0.11 mol) of p-chloranil. After refluxing for 90 minutes, the suspension was diluted with 200 mL of dichloromethane. After filtration, the solution was washed twice with 100 mL 1N NaOH. The organic phase was dried (MgSO$_4$), the solvent removed by rotary evaporation and the residue purified by flash chromatography (6:1 hexanes/EtOAc; SiO$_2$, 2×18″) to yield 15.0 gm (69%) of the product as a yellow oil. Field desorption mass spectrum: m/e 217s (M+). Anal. calcd. for C$_{13}$H$_{15}$NO$_2$: C, 71.9; H, 7.0; N, 6.4. Found: C, 71.8; H, 7.0; N, 6.3. $^1$H 270 NMR (CDCl$_3$): δ 6.69 (d, 1H), 6.74 (dd, 1H), 7.37 (d, 1H), 7.46 (d, 1H), 9.58 (s, 1H).

The photosensitizers of this invention are prepared by condensation of the intermediates of Examples 1 and 2 in pyridine with an active methylene compound such as 3-cyano-4-phenyl-2-furanone, cyclopentanone, 3-acetyl-7-(N,N-dialkylamino)coumarins and the like.

The following examples illustrate the condensation of the intermediate with an active methylene compound to produce the photosensitizers of the invention.

Example 3

Preparation of
3-Cyano-4-phenyl-5-(2,3,6,7-tetrahydro-1H,5H-benzo[i,j]-furano[3,2-g]quinolizine-9-yl-methylene)-2-furanone, Dye 1, Table I To 3 mL of pyridine in a 10 mL round-bottomed flask was added 120 mg (0.5 mmol) of the compound of Example 1 and 80 mg (0.5 mmol) of 3-cyano-4-phenyl-2-furanone. The solution was heated at 80° C. for 3 hours, cooled and poured into 20 mL dilute $NH_4Cl$. The resulting mixture was extracted 2X with 20 mL 3:2 hexanes/$Et_2O$ and the combined organic extracts washed once with 10 mL of water. The organic phase was dried ($MgSO_4$) and the solvent removed by rotary evaporation. The resulting solid was puridied by flash chromatography (7:2 cyclohexane/EtOAc; $SiO_2$, 1×12") to yield 40 mg (22%) of Compound 6, Table I. Field desorption mass spectrum: m/e 408 ($M^+$); m.p. 231°–32° C. Anal. calcd. for $C_{26}H_{20}N_2O_3$: C, 76.4; H, 4.9; N, 6.9. Found: C, 76.1; H, 4.7; N, 6.8.

Example 4

Preparation of
3-Cyano-5-[6-(N,N-diethylamino)benzo[b]furanylmethylene]-4-phenyl-2-furanone, Dye 2, Table I To 5 mL of pyridine in a 15 mL round-bottom flask was added 217 mg (1 mmol) of the compound of Example 2 and 172 mg (1 mmol) of 3-cyano-4-phenyl-2-furanone. The solution was heated at 80° C. for one hour, colled and poured into 20 mL dilute $NH_4Cl$. The resulting mixture was extracted 2X with 20 mL 3:2 hexanes $Et_2O$ and the combined organic extracts were washed once with 10 mL of water. The organic phase was dried ($MgSO_4$) and the solvent removed by rotary evaporation. The resulting solid was purified by flash chromatography (7:2 cyclohexane/EtOAc; $SiO_2$, 1×12") to yield 292 mg of dye. Anal. calcd. for $C_{24}H_{20}N_2O_3$: C, 74.2; H, 5.4; N, 7.5. Found: C, 74.0; H, 5.2; N, 6.9.

Example 5

Preparation of
7-N,N-Diethylamino-3-{3-[6-(N,N-diethylamino)benzo[b]-furanyl]acryloyl}coumarin, Dye 3, Table I To 25 mL of absolute ethanol in a 50 mL round-bottomed flask was added 217 mg (1 mmol) of 6-(N,N-diethylamino)-2-formylbenzo[b]furan and 259 mg (1mmol) of 3-acetyl-7-(N,N-diethylamino)coumarin. After refluxing for several minutes to dissolve the solids, 100 mg of piperidine was added and reflux was continued for one hour. The solution was allowed to cool to room temperature and then placed in a freezer overnight. The solid was filtered and recrystallized from 50 mL of ethanol to yield the product as deep red needles. Field desorption wass spectrum: m/e 458 ($M^+$); m.p. 169°–171° C.

Example 6

Preparation of
9-[3-(2,3,6,7-Tetrahydro-1H,5H-benzo[i,j]furano[3,2-g]-quinolizin-9-yl)acryloyl]-1,2,4,5-tetrahydro-3H,6H,10H[1]benzopyrano-]9,9a,1-gh]quinolazin-10one, Dye 4, Table I To 25 mL of absolute ethanol in a 50 mL round-bottomed flask was added 241 mg (1 mmol) of the compound of Example 3 and 283 mg (1 mmol) of 3-acetyl-7-(N,N-diethylamino)coumarin. After refluxing for several minutes to dissolve the solids, 100 mg of piperidine was added and reflux was continued for two hours. The solution was allowd to cool and the solid filtered to yield 450 mg (89%) of product as black needles. Field desorption mass spectrum: m/e 506 ($M^+$); m.p. 242°–244° C.

Example 7

Preparation of 8-(p-methoxyphenacyloxy)julolidine

A mixture of 4.65 g (0.025 M) of 8-hydroxyjulolidine, 5.50 g (0.024 M) of p-(methoxy)phenacyl bromide and 3.45 g (1 equiv.) of potassium carbonate in 30 mL of acetone and 15 drops of water was refluxed overnight. The reaction mixture was poured in water and extracted with ether. The ether extract was dried ($MgSO_4$), rotary evaporated and the residue was purified by flash chromatography to give 5.82 g (72%) of product: F.D. m/e 337 ($M^+$); Anal. Calc'd for $C_{21}H_{23}NO_3$: C, 74.8; H, 6.9; N, 4.2. Found: C 73.9; H, 6.8; N, 4.0.

Example 8

Preparation of
8-(p-methoxyphenyl)-2,3,6,7-tetrahydro-1H,5H-benzo[i,j]-furano[3,2-g]quinolizine A mixture of 5.52 g (0.0164 M) of 8-(p-methoxyphenacyloxy)julolidine and 1.36 g (0.01 M) of zinc chloride in 10 mL of ethanol was refluxed for 4 hours. The reaction mixture was poured into dilute HCl and extracted with methylene chloride. The extracts were washed with water, dried ($MgSO_4$), rotary evaporated. The residue was recrystallized from hexanes and a small amount of ethyl acetate to give 2.85 g (55%) of product: F.D. m/e 319 ($M^+$); Anal. Calc'd. for $C_{21}H_{21}NO_2$: C, 79.0; H, 6.6; N, 4.4. Found: C, 78.0; H, 6.6; N, 4.2.

Example 9

Preparation of
9-Formyl-8-(p-methoxyphenyl)-2,3,6,7-tetrahydro-1H,5H-benzo-[i,j]furano[3,2-g]quinolizine A Vilsmeir reagent was prepared by mixing 0.223 g (1.5 mmol) of phosphoryl chloride and 1 mL of DMF and stirring at room temperature for 1 hour. To the Vilsmeir reagent was added 0.32 g (1 mmol) of the product from Example 12. The reaction mixture was heated at 50° C. for 10 minutes, poured into aqueous sodium acetate, and extracted with methylene chloride. The extracts were dried ($MgSO_4$), rotary evaporated and flash chromatographed to give 268 mg (77%) of product: F.D. m/e 347 ($M^+$); Anal. Calc'd. for $C_{22}H_{21}NO_3$: C, 76.1; H, 6.1; N, 4.0. Found: C, 75.7; H, 5.7; N, 3.7.

Example 10

Preparation of
3-Cyano-4-phenyl-5-[8-(p-methoxyphenyl)-2,3,6,7-tetrahydro-1H,5H-benzo[i,j]furano[3,2-g]-quinolizine-9-yl-methylene]-2-furanone, Dye 6, Table I A mixture of 52 mg (0.15 mmol) of the aldehyde from Example 13 and 27 mg (1 equiv.) of 3-cyano-4-phenyl-2-furanone in 0.7 mL of pyridine was heated at 90° C. for 2 hours. To the hot reaction mixture were added 12 mL of acetonitrile, and the mixture was brought to reflux for 5 minutes. Dye 6 crystallized on cooling to give 50 mg (67%) of crystals: F.D. m/e 514 ($M^+$); Anal. Calc'd.

for $C_{33}H_{26}N_2O_4$: C, 77.0; H, 5.1; N, 5.4. Found: C, 75.9; H, 5.1; N, 5.4.

In Table I the effectiveness of the 6-tertiary aminobenzofuran nucleus of Dyes 1 through 7 in bathochromically shifting the maximum absorption wavelength of the dyes of this invention is illustrated by comparing the maximum absorptions of these dyes with dyes containing structurally similar nuclei.

TABLE I

[Core structure with substituents $C_6H_5$, CN, $D^1$, O shown]

| $D^1$ | Compound | λ-max nm ($CH_2Cl_2$) | $\epsilon(10^3)$ |
|---|---|---|---|
| [julolidine-fused benzofuran structure] | Dye 1 | 655 | 52 |
| [Et$_2$N-substituted benzofuran] | Dye 2 | 613 | 33 |
| [Et$_2$N-phenyl] | Control | 537 | 50 |
| [Me$_2$N-styryl] | Control | 565 | 44 |
| [julolidine] | Control | 570 | 65 |
| [Et$_2$N-benzofuran with Ph] | Dye 5 | 620 | 53 |

TABLE I-continued

[Structure: C₆H₅ and CN substituents on vinyl with D¹ group and carbonyl]

| Compound | λ-max nm (CH₂Cl₂) | ε(10³) |
|---|---|---|
| Dye 6 | 660 | 55 |
| Dye 7 | 696 | 49 |

Complete Dye Structure

| | Compound | λ-max nm (CH₂Cl₂) | ε(10³) |
|---|---|---|---|
| | Control | 415 | 38 |
| | Control | 430 | 38 |
| | Dye 3 | 445<br>495<br>(C₆H₆) | 31<br>50 |

TABLE I-continued

| Compound | λ-max nm (CH$_2$Cl$_2$) | ε(10$^3$) |
|---|---|---|
| Dye 4 | 461 | 32 |
|  | 511 (C$_6$H$_6$) | 52 |

Example 11

Preparation of 2,5-Bis[6-(N,N-diethylamino)benzo[b]-2-furanylmethylene]cyclopentanone, Dye 8, Table II A solution of 370 mg (1.7 mmol) of the aldehyde of Example 2 and 72 mg (0.085 mmol) of cyclopentanone in 15 mL of 2N methanolic KOH was refluxed for 1½ hours. The solution was cooled to room temperature and the product was filtered, washed with MeOH (yield 290 mg, 72%) and recrystallized from a cyclohexane/toluene mixture. The compound is solvatochromic with an absorption maximum of 565 nm in methanol.

Example 12

Preparation of 2,5-Bis(2,3,6,7-tetrahydro-1H,5H-benzo[i,j]furano[3,2-g]quinolizine-9-yl-methylene)cyclopentanone, Dye 9, Table II This compound was prepared as described for Example 7 except using the intermediate of Example 1. It has an absorption maximum of 590 nm in methanol.

The absorption data for the dyes of Examples 7 and 8 are given in the following Table II.

Examples 13–16

Evidence of the utility of 6-tert.-aminobenzofuran dyes as photosensitizer coinitiators for hardening organic components containing ethylenic unsaturation sites is provided in Examples 13–16 and Table III.

A series of negative working photoresist compositions PR-1 each containing a different dye being tested as a photosensitizer were prepared. The photosensitizing dye was added at 7 to 20 mg in Examples 9 and 10 and at 5 to 10 mg in Examples 11 and 12. Activator A was added at 75 to 150 mg. Within these ranges the speed of the photoresist remained within ±20%.

PR-1 was formulated as follows:

| | |
|---|---|
| 2.34 g | Binder A |
| 1.17 g | Monomer A |
| 1.17 g | Monomer B |
| 0.012 g | Inhibitor A |
|  | Activator A |
|  | Photosensitizer |
| 10.32 g | Solvent (Dichloromethane) |

Binder A exhibited the following structure

TABLE II

| Dye No. | λ-max nm (CH$_2$Cl$_2$) | ε(10$^3$) |
|---|---|---|
| 8. | 513 (Cyclohexane) | 89 |
|  | 532 (Toluene) | 67 |
|  | 538 (Acetonitrile) | 59 |
|  | 565 (Methanol) | 54 |
| 9. | 530 (Cyclohexane) |  |
|  | 542 (Ethyl acetate) |  |
|  | 590 (Methanol) |  |

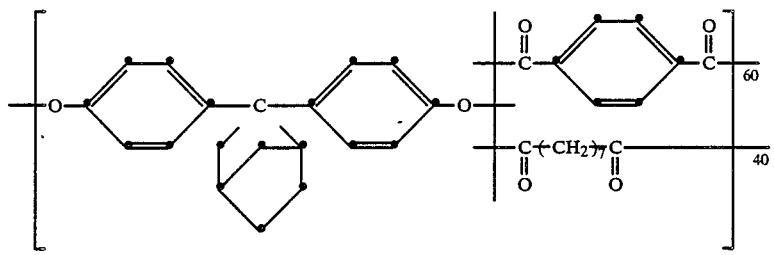

Monomer A exhibited the following structure

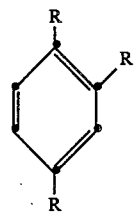

R = —C(=O)—O—CH₂—CH₂—O—C(=O)—CH=CH₂

Monomer B exhibited the following structure

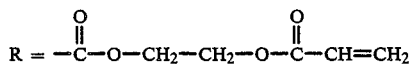

Inhibitor A exhibited the following structure

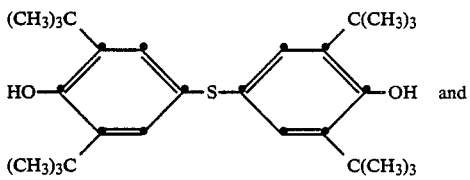

Activator A was 1-methoxy-4-phenylpyridinium tetrafluoroborate.

The formulations were throughly mixed and then hand-coated on copper sheets using a 0.3 coating knife. The coatings were dried for 10 minutes at 90° C., covered with a polypropylene sheet and exposed through a Kodak T-14® tablet having 14 equal density steps ranging from zero to 2.1. The coated samples were given 1 minute exposures using a medium-high pressure mercury lamp (Exposure I, Colight Inc.) and a W-16 Wratten® filter, which removed 99.9 percent of radiation less than 436 nm in wavelength. In other words, the samples were responding primarily to the 546 and 578 nm emission lines of the mercury lamp. The filter was inserted, since, in the absence of a photosensitizer, the composition was incapable of responding in this wavelength region. The exposed samples were then postbaked for 10 minutes at 90° C. The samples were spray developed for 2 minutes using 1,1,1-trichloroethane. Response of the samples is summarized in Table III.

TABLE III

| Examples | Dye Initiator | $\lambda_{max}{}^a$ | No of steps |
|---|---|---|---|
| 13 | (structure) | 510 | 7½ |
| 14 | (structure) | 530 | 8½ |

TABLE III-continued

| Examples | Dye Initiator | $\lambda_{max}^a$ | No of steps |
|---|---|---|---|
| 15 | | 558 | 9 |
| 16 | | 578 | 9 |

$^a$measured in coatings of the photopolymerizable composition.

A particularly attractive feature, especially of Example 15 (Dye 8) and Example 16 (Dye 9) is the photobleaching of the dye which occurs concurrently with the induced polymerization. In the case of these dyes, the bleaching is not accompanied by new maxima in the visible region.

Example 17

This example illustrates the effectiveness of the photosensitizers of this invention when employed in combination with electron donor activators, such as borates.

A negative working photoresist composition PR-2 was formulated as follows:

| | |
|---|---|
| 2.5 g | Binder A |
| 1.25 g | Monomer A |
| 1.25 g | Monomer B |
| 0.013 g | Inhibitor B |
| 0.013 g | Activator B |
| 0.009 g | Dye 7 (photosensitizer) |
| 10.0 g | Solvent (Dichloromethane) |

Inhibitor B exhibited the following structure

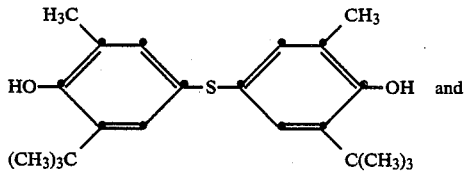 and

Activator B exhibited the following structure:

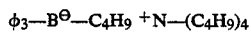

Except as otherwise indicated the coating, exposure, and development procedures were identical to those of Examples 13-16. Exposure was undertaken for 3 minutes through a W-16 Wratten filter using a Nu-arc FT32L® filp-top platemaker equipped with a 4000 watt pulsed Xenon lamp. Between 7 and 8 steps were developed.

The invention has been described in detail with particular reference to preferred embodiments thereof, but it will be understood that variations and modifications can be effected within the spirit and scope of the invention.

What is claimed is:

1. A photographic imaging system comprised of
    a hardenable organic component containing ethylenic unsaturation sites and
    coinitators for ethylenic addition comprised of
        an activator and,
        a photosensitizer which satisfies the formula:

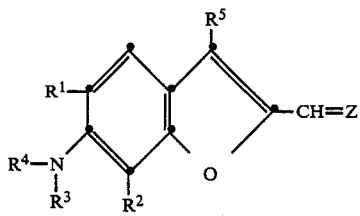

where
    Z represents the atoms providing an electron withdrawing —C(O)— or —SO$_2$— group;
    $R^1$, $R^2$, and $R^5$ each independently represent hydrogen, alkyl, or aryl;
    $R^3$ and $R^4$ each independently represent alkyl; or at least one of the substituent pairs represented by $R^1$ and $R^4$, $R^2$ and $R^3$, and $R^3$ and $R_4$ complete a 5 or 6 membered ring.

2. A photographic imaging system according to claim 1 in which said hardenable organic component is comprised of at least one addition polymerizable ethylenically unsaturated compound having a boiling point above 100° C. at normal pressure.

3. A photographic imaging system according to claim 2 in which said polymerizable ethylenically unsaturated compound is an monomer.

4. A photographic imaging system according to claim 2 in which said polymerizable ethylenically unsaturated compound is an oligomer.

5. A photographic imaging system according to claim 2 in which said polymerizable ethylenically unsaturated compound is a crosslinkable polymer.

6. A photographic imaging system according to claim 1, in which the activator is an azinium salt.

7. A photographic imaging system according to claim 1 in which $R^1$, $R^2$, $R^3$, and $R^4$ complete a julolidine ring structure.

8. A photographic imaging system according to claim 1 in which Z satisfies the formula

where
W is a carbonyl or sulfonyl containing electron withdrawing group;
L is independently in each occurrence a methine group; and
n is zero or an integer of up to 4.

9. A photographic imaging system according to claim 1 in which the photosensitizer satisfies the formula:

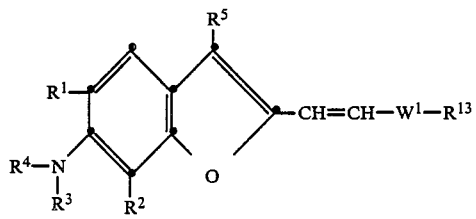

where
$W^1$ represents

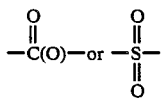

and
$R^{13}$ represents a 3-coumarinyl group.

10. A photographic imaging system according to claim 9 in which the 3-coumarinyl group satisfies the formula:

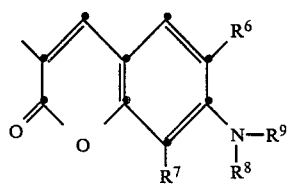

where
$R^6$ and $R^7$ each independently represent hydrogen, alkyl, or aryl;
$R^8$ and $R^9$ each independently represent alkyl; or
at least one of the substituent pairs represented by $R^6$ and $R^9$, $R^7$ and $R^8$, and $R^8$ and $R^9$ complete a 5 or 6 membered ring.

11. A photographic imaging system according to claim 10 in which $R^6$, $R^7$, $R^8$, and $R^9$ complete a julolidine ring structure.

12. A photographic imaging system according to claim 10 in which the photosensitizer is chosen from the group consisting of
(a) 7-N,N-dialkylamino-3-{3-[6-(N,N-dialkylamino)-benzo[b]furanyl]acryloyl}coumarin and
(b) 9-[3-(2,3,6,7-tetrahydro-1H,5H-benzo[i,j]-furano[3,2-g]quinolinizin-9-yl)acryloyl]-1,2,4,5-tetrahydro-3H,6H,10H[1]benzopyrano[9,9a,1-gh]quinolazin-10-one.

13. A photographic imaging system according to claim 1 in which the photosensitizer satisfies the formula:

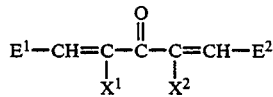

where
$E^1$ and $E^2$ are independently 2-(6-amino)benzofuranyl groups and
$X^1$ and $X^2$ are independently hydrogen, alkyl, or aryl or together complete a 5 to 7 membered ring.

14. A photographic imaging system according to claim 13 in which $X^1$ and $X^2$ together complete a ring satisfying the formula:

or

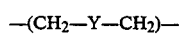

where
n is 2 to 4;
Y is —$NR^{10}$— or —O—; and
$R^{10}$ is hydrogen, lower alkyl, or phenyl.

15. A photographic imaging system according to claim 13 in which $X^1$ and $X^2$ together complete a cyclopentanone ring.

16. A photographic imaging system according to claim 13 in which at least one of $E^1$ and $E^2$ satisfies the formula:

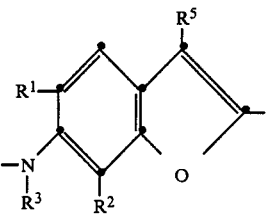

where
$R^1$, $R^2$, and $R^5$ each independently represent hydrogen, alkyl, or aryl;
$R^3$ and $R^4$ each independently represent alkyl; or
at least one of the substituent pairs represented by $R^1$ and $R^4$, $R^2$ and $R^3$, and $R^3$ and $R^4$ complete a 5 or 6 membered ring.

17. A photographic imaging system according to claim 16 in which $R^1$, $R^2$, $R^3$, and $R^4$ complete a julolidine ring structure.

18. A photographic imaging system according to claim 17 in which the photosensitizer is 2,5-bis-(2,3,6,7-tetrahydro-1H,5H-benzo[i,j]furano[3,2-g]-quinolizine-9-yl-methylene)cyclo-pentanone.

19. A photographic imaging system according to claim 1 in which Z is a furan-2-one-5-ylidene nucleus.

20. A photographic imaging system according to claim 19 in which Z satisfies the formula:

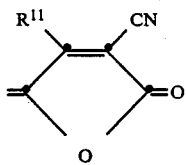

where R[11] is hydrogen, alkyl, or aryl.

21. A photographic imaging system according to claim 20 in which R[11] is phenyl.

22. A photographic imaging system according to claim 21 in which the photosensitizer is chosen from the class consisting of 3-cyano-4-phenyl-5-(2,3,6,7-tetrahydro-1H,5H-benzo-[i,j]furano[3,2-g]quinolizin-9-yl-methylene)-2-furanone;

3-cyano-4-phenyl-5-(2,3,6,7-tetrahydro-1H,5H-benzo-[i,j]furano[3,2-g]quinolizine-9-yl-methylene)-2-furanone;

3-cyano-4-phenyl-5-[8-(p-methoxyphenyl)-2,3,6,7-tetrahydro-1H,5H-benzo[i,j]furano[3,2-g]quinolizine-9-yl-methylene]-2-furanone;

3-cyano-4-phenyl-5-(8-phenyl-2,3,6,7-tetrahydro-1H,5H-benzo[i,j]furano[3,2-g]quinolizine-9-ylmethylene)-2-furanone; and 3-cyano-4-phenyl-5-{3-[8-(p-methoxyphenyl)2,3,6,7-tetrahydro-1H,5H-benzo[i,j]furano[3,2-g]quinolizine-9-yl]-2-propenylidene}-2-furanone.

23. A photographic imaging system according to claim 1 in which the activator is an electron acceptor.

24. A photographic imaging system according to claim 23 in which the activator is an N-alkoxypyridinium salt.

25. A photographic imaging system according to claim 1 in which the activator is an electron donor.

26. A photographic imaging system according to claim 25 in which the activator is a triarylborate.

* * * * *